United States Patent
Choi et al.

(10) Patent No.: US 8,883,579 B2
(45) Date of Patent: Nov. 11, 2014

(54) ARRAY SUBSTRATE FOR ORGANIC ELECTROLUMINESCENT DISPLAY DEVICE AND METHOD OF FABRICATING THE SAME

(75) Inventors: Hee-Dong Choi, Gumi-si (KR);
Jin-Chae Jeon, Daegu (KR);
Seung-Joon Jeon, Paju-si (KR);
Hoe-Yong Kim, Busan (KR)

(73) Assignee: LG Display Co., Ltd. (KR)

( * ) Notice: Subject to any disclaimer, the term of this patent is extended or adjusted under 35 U.S.C. 154(b) by 1 day.

(21) Appl. No.: 13/285,489

(22) Filed: Oct. 31, 2011

(65) Prior Publication Data
US 2012/0104399 A1 May 3, 2012

(30) Foreign Application Priority Data
Nov. 2, 2010 (KR) .......................... 10-2010-0108271

(51) Int. Cl.
*H01L 27/12* (2006.01)
*H01L 27/32* (2006.01)

(52) U.S. Cl.
CPC ........ *H01L 27/1255* (2013.01); *H01L 27/1288* (2013.01); *H01L 27/3265* (2013.01); *H01L 27/3223* (2013.01)
USPC ..................... 438/158; 257/59; 257/E33.053

(58) Field of Classification Search
USPC ......... 438/34–35, 73–81, 109, 128, 381–399, 438/587, 982, 66–67, 158; 257/59, 71, 257/E33.053, E21.412
See application file for complete search history.

(56) References Cited

U.S. PATENT DOCUMENTS

2008/0026299 A1* 1/2008 Chai et al. .......................... 430/5
2008/0213472 A1* 9/2008 Song .............................. 427/162

FOREIGN PATENT DOCUMENTS

CN 1963614 5/2007

OTHER PUBLICATIONS

Office Action issued in corresponding Chinese Patent Application No. 201110346027.2, mailed Nov. 1, 2013, 20 pages.

* cited by examiner

*Primary Examiner* — Tony Tran
(74) *Attorney, Agent, or Firm* — Brinks Gilson & Lione

(57) ABSTRACT

A method of fabricating an array substrate for an organic electroluminescent display device includes forming a semiconductor layer, a semiconductor dummy pattern, a first storage electrode and a first gate insulating layer on a substrate; forming a second gate insulating layer on the semiconductor layer and the first storage electrode; forming a gate electrode and a second storage electrode on the second gate insulating layer; forming ohmic contact layers by doping impurities into both sides of the semiconductor layer; forming an inter insulating layer on the gate electrode and the second storage electrode; forming source and drain electrodes and a third storage electrode on the inter insulating layer; forming a passivation layer on the source and drain electrodes and the third storage electrode; forming a first electrode and a fourth storage electrode on the passivation layer; and forming a spacer and a bank on the first electrode.

9 Claims, 10 Drawing Sheets

ARRAY SUBSTRATE FOR ORGANIC ELECTROLUMINESCENT DISPLAY DEVICE AND METHOD OF FABRICATING THE SAME

This application claims the benefit of Korea Patent Application No. 10-2010-0108271, filed on Nov. 2, 2010, the entire contents of which is incorporated herein by reference for all purposes as if fully set forth herein.

BACKGROUND

1. Field of the Invention

The present disclosure relates to an array substrate for an organic electroluminescent display device, and more particularly, to an array substrate for an organic electroluminescent display device that includes a polycrystalline silicon thin film transistor and a method of fabricating the same.

2. Discussion of the Related Art

With rapid development of information technologies, display devices for displaying a large amount of information have been promptly developed. Recently, flat panel display (FPD) devices having a thin profile, light weight and low power consumption have been suggested and actively pursued.

Among these, organic electroluminescent display devices have been recently spotlighted because they have many merits as follows: organic electroluminescent display devices have high brightness and low driving voltages; because they are self-luminous, the organic electroluminescent display devices have excellent contrast ratios and ultra thin thicknesses; the organic electroluminescent display devices have response time of several micro seconds, and there are advantages in displaying moving images; the organic electroluminescent display devices have wide viewing angles and are stable under low temperatures; since the organic electroluminescent display devices are driven by low voltage of direct current (DC) 5V to 15V, it is easy to design and manufacture driving circuits; and a manufacturing process of an organic electroluminescent display device is very simple because substantially only deposition and encapsulation apparatus is required. In the organic electroluminescent display devices, active matrix type display devices have been widely An organic electroluminescent display device includes an array substrate on which thin film transistors for turning on/off respective pixel regions are formed. Thin film transistors may have polycrystalline silicon as a semiconductor layer. An array substrate for an organic electroluminescent display device including polycrystalline silicon thin film transistors, generally, is fabricated through 9 or 10 mask processes.

After forming a material layer on a substrate, a mask process includes steps of forming a photoresist layer on the material layer, exposing the photoresist layer to light through a photo mask, developing the light-exposed photoresist layer to form a photoresist pattern, etching the material layer using the photoresist pattern as a mask, and stripping the photoresist pattern.

Therefore, to perform one mask process, apparatus and materials for each step are needed, and time for each step is also required. In manufacturing an organic electroluminescent display device, trials and efforts for reducing the mask processes have been made.

Meanwhile, in an organic electroluminescent display device including polycrystalline silicon thin film transistors, a storage capacitor having a large capacitance has been requested at each pixel region for stability in displaying images.

By the way, as the display device has high resolution, a size of the pixel region decreases, and the capacitance of the storage capacitor is lowered due to a decreased area of electrodes of the storage capacitor. To increase the capacitance of the storage capacitor, the area of the electrodes of the storage capacitor may be increased, and the aperture ratio of the display device may be decreased.

BRIEF SUMMARY

A method of fabricating an array substrate for an organic electroluminescent display device includes preparing a substrate including a pixel region, a driving area and a storage area; forming a semiconductor layer, a semiconductor dummy pattern, a first storage electrode and a first gate insulating layer on the substrate, wherein the semiconductor layer and a first portion of the first gate insulating layer are sequentially disposed in the driving area, and the semiconductor dummy pattern, a second portion of the first gate insulating layer and the first storage electrode are sequentially disposed in the storage area; forming a second gate insulating layer on the semiconductor layer and the first storage electrode; forming a gate electrode and a second storage electrode on the second gate insulating layer, wherein the gate electrode corresponds to a central portion of the semiconductor layer, and the second storage electrode corresponds to the first storage electrode; forming ohmic contact layers by doping impurities into both sides of the semiconductor layer using the gate electrode as a doping mask; forming an inter insulating layer on the gate electrode and the second storage electrode, wherein the inter insulating layer has first and second contact holes exposing the ohmic contact layers; forming source and drain electrodes and a third storage electrode on the inter insulating layer, wherein the source and drain electrodes contact the ohmic contact layers, and the third storage electrode corresponds to the second storage electrode; forming a passivation layer on the source and drain electrodes and the third storage electrode, wherein the passivation layer has a drain contact hole exposing the drain electrode; forming a first electrode and a fourth storage electrode on the passivation layer, wherein the first electrode contacts the drain electrode through the drain contact hole, and the fourth storage electrode corresponds to the third storage electrode; and forming a spacer and a bank on the first electrode, wherein the spacer is disposed between adjacent pixel regions and has a first thickness, and the bank is disposed along a border of the pixel region and has a second thickness thinner than the first thickness.

In another aspect, an array substrate for an organic electroluminescent display device includes a substrate including a pixel region, a driving area and a storage area; a semiconductor layer, a semiconductor dummy pattern, a first storage electrode and a first gate insulating layer formed on the substrate, wherein the semiconductor layer and a first portion of the first gate insulating layer are sequentially disposed in the driving area, and the semiconductor dummy pattern, a second portion of the first gate insulating layer and the first storage electrode are sequentially disposed in the storage area; a second gate insulating layer on the first portion of the first gate insulating layer and the first storage electrode; a gate electrode and a second storage electrode on the second gate insulating layer, wherein the gate electrode corresponds to a central portion of the semiconductor layer, and the second storage electrode corresponds to the first storage electrode; an inter insulating layer on the gate electrode and the second storage electrode, wherein the inter insulating layer has first and second contact holes exposing side portions of the semiconductor layer at both sides of the central portion; source and drain electrodes and a third storage electrode on the inter insulating layer, wherein the source and drain electrodes contact the side portions of the semiconductor layer, and the third storage electrode corresponds to the second storage electrode; a passivation layer on the source and drain electrodes and the third storage electrode, wherein the passivation layer has a drain contact hole exposing the drain electrode; a first electrode and a fourth storage electrode on the passivation layer, wherein the first electrode contacts the drain electrode, and the fourth storage electrode corresponds to the third storage electrode; and a spacer and a bank on the first electrode, wherein the spacer is disposed between adjacent pixel regions and has a first thickness, and the bank is disposed along a border of the pixel region and has a second thickness thinner than the first thickness.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE DRAWINGS AND THE PRESENTLY PREFERRED EMBODIMENTS

Reference will now be made in detail to embodiments of the present invention, examples of which are illustrated in the accompanying drawings.

Figure 1A:
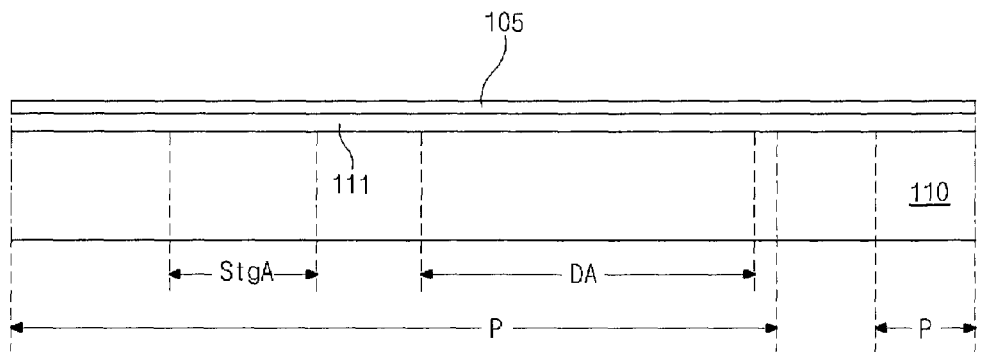
FIGS. 1A to 1R are cross-sectional views of illustrating a pixel region of an array substrate for an organic electroluminescent display device in steps of fabricating the same according to an exemplary embodiment of the present invention.
Figure 1B:
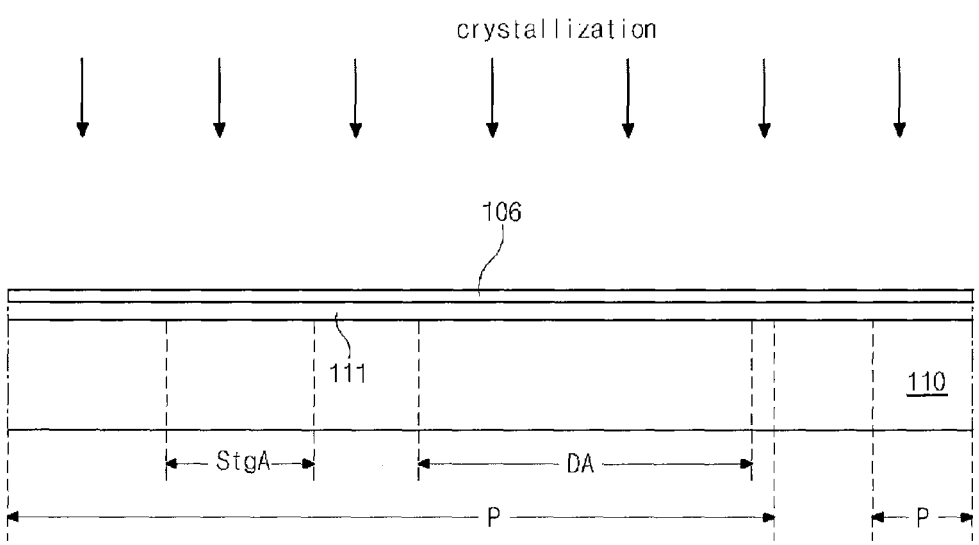
Figure 1C:
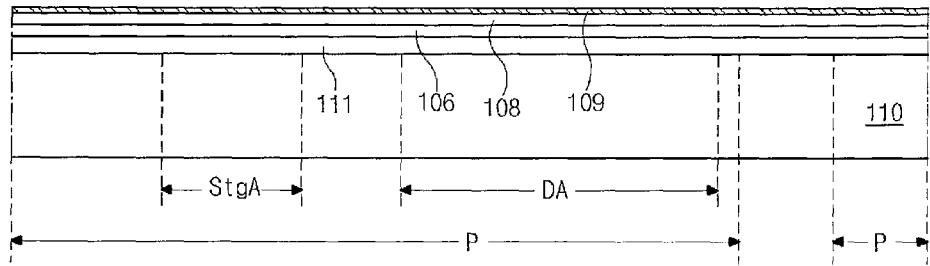
Figure 1D:
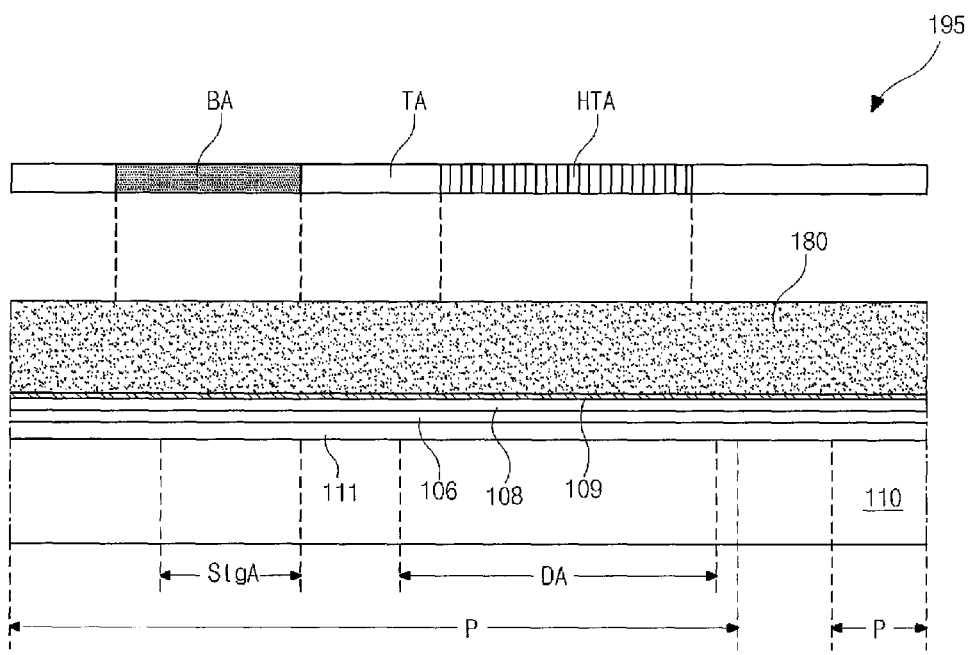
Figure 1E:
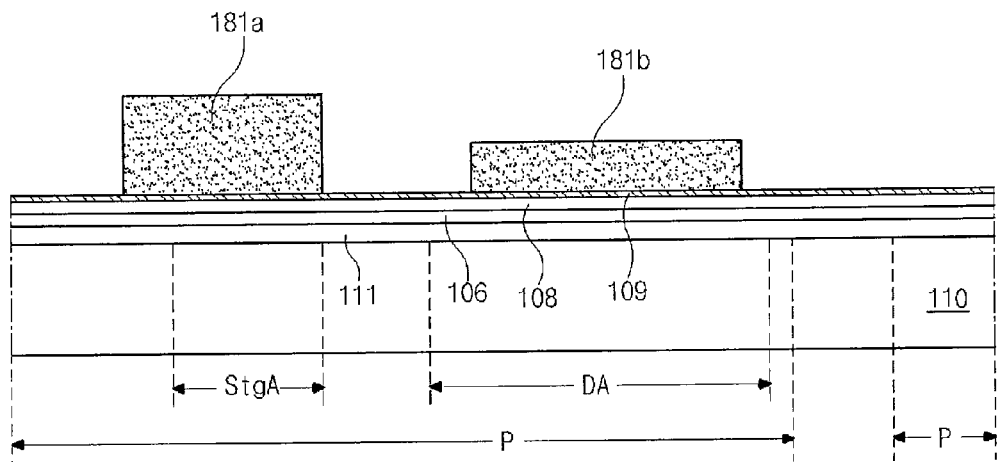
Figure 1F:
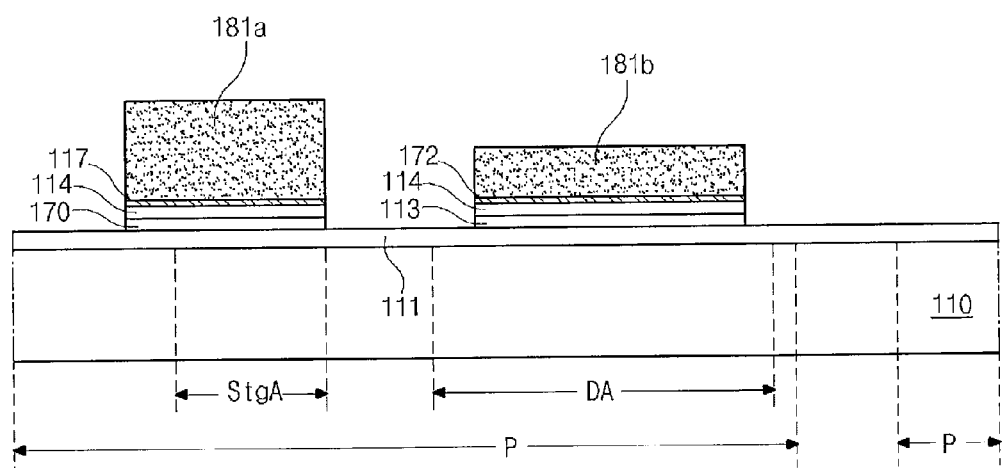
Figure 1G:
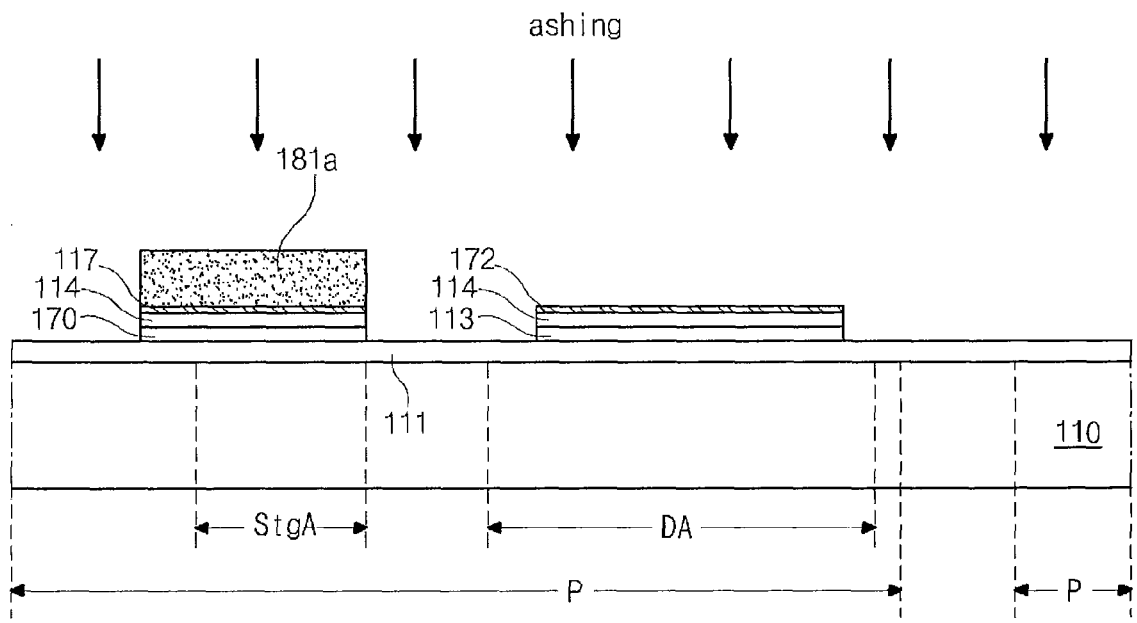
Figure 1H:
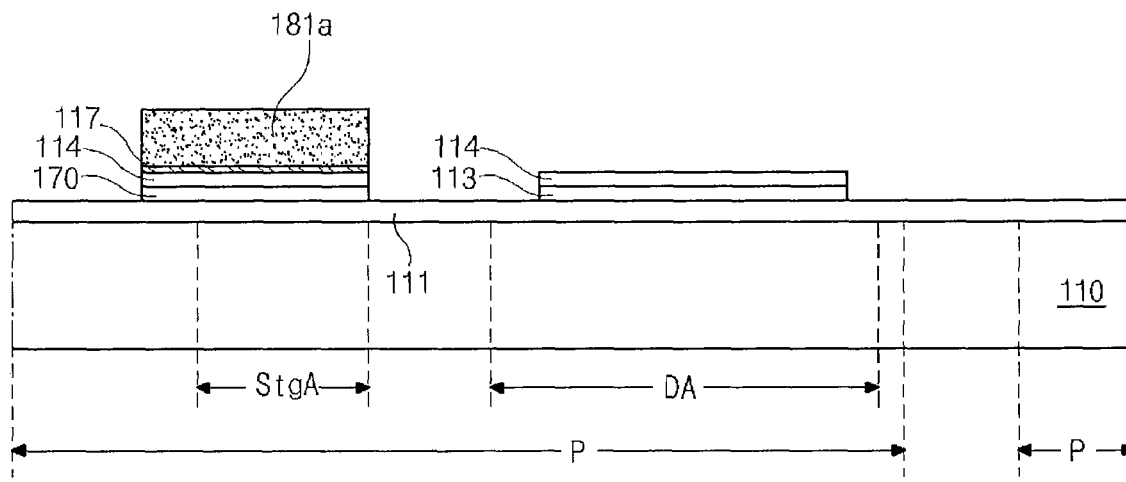
Figure 1I:
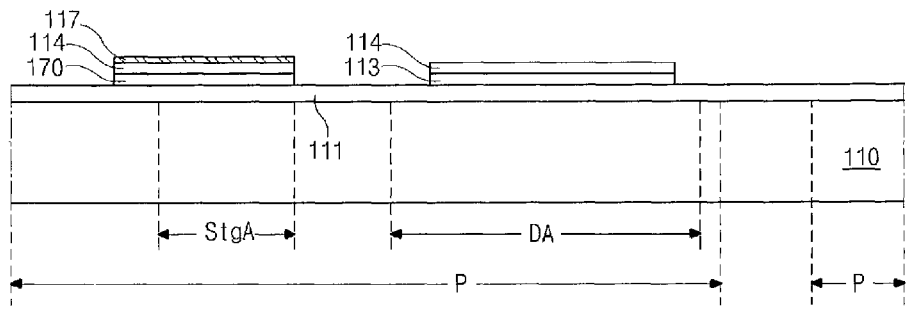
Figure 1J:
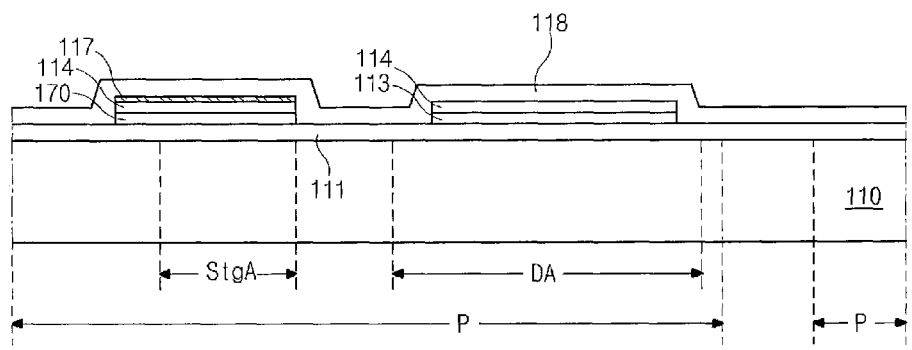
Figure 1K:
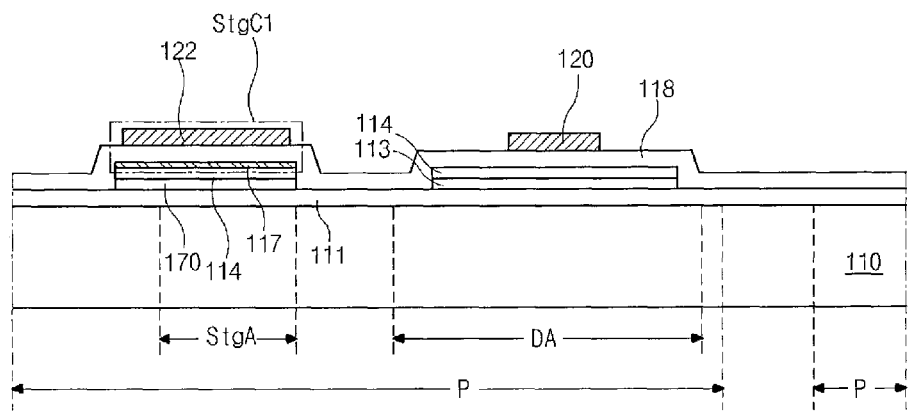
Figure 1L:
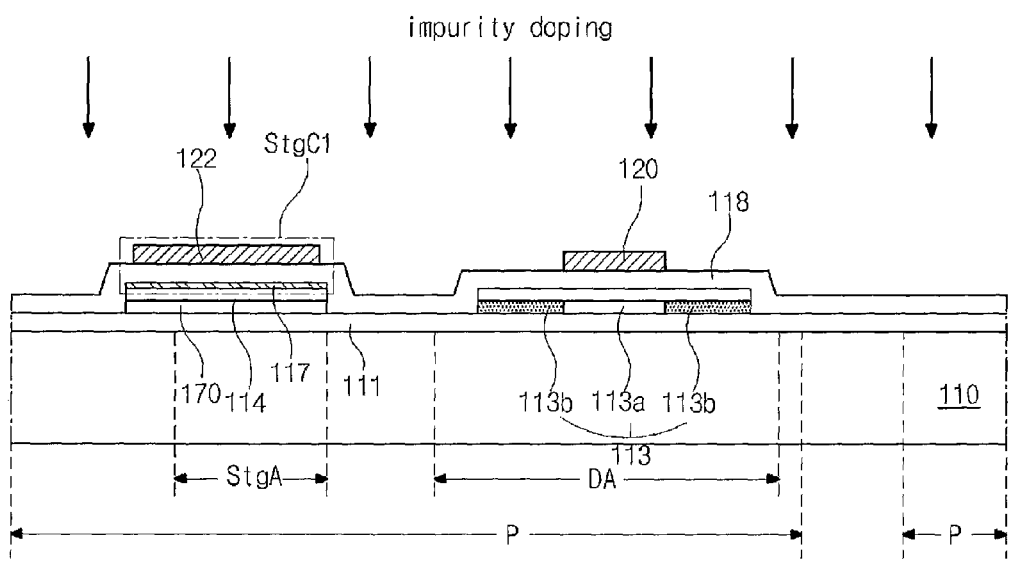
Figure 1M:
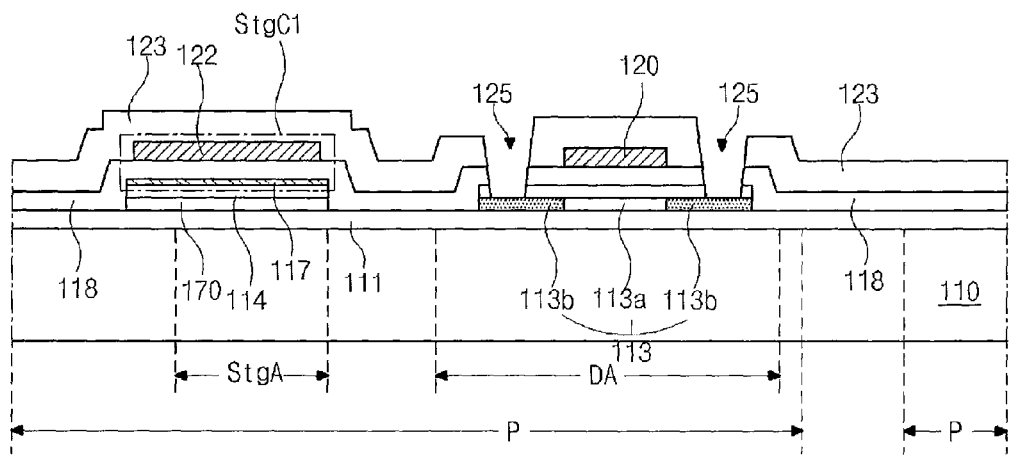
Figure 1N:
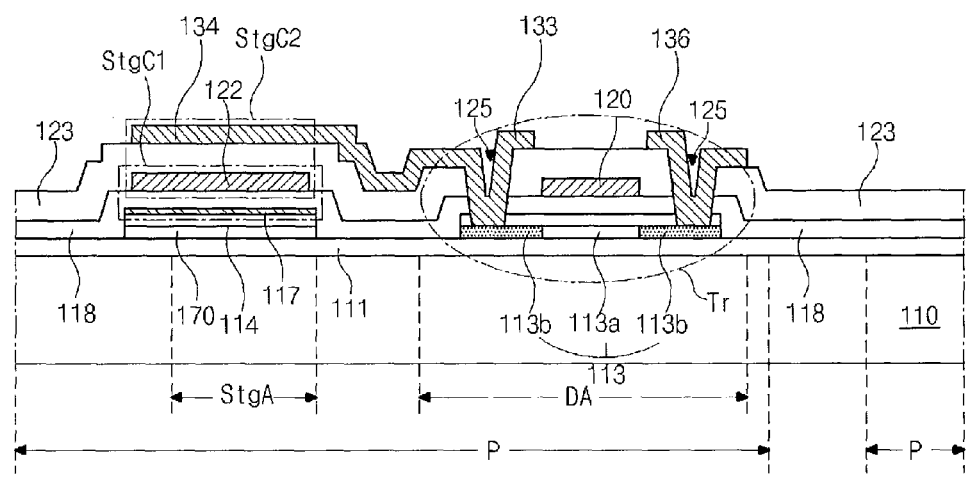
Figure 1O:
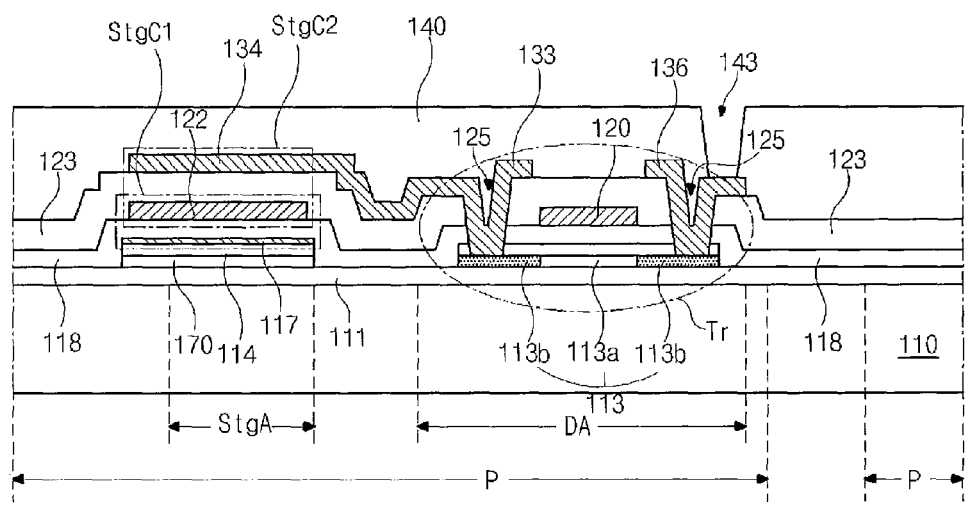
Figure 1P:
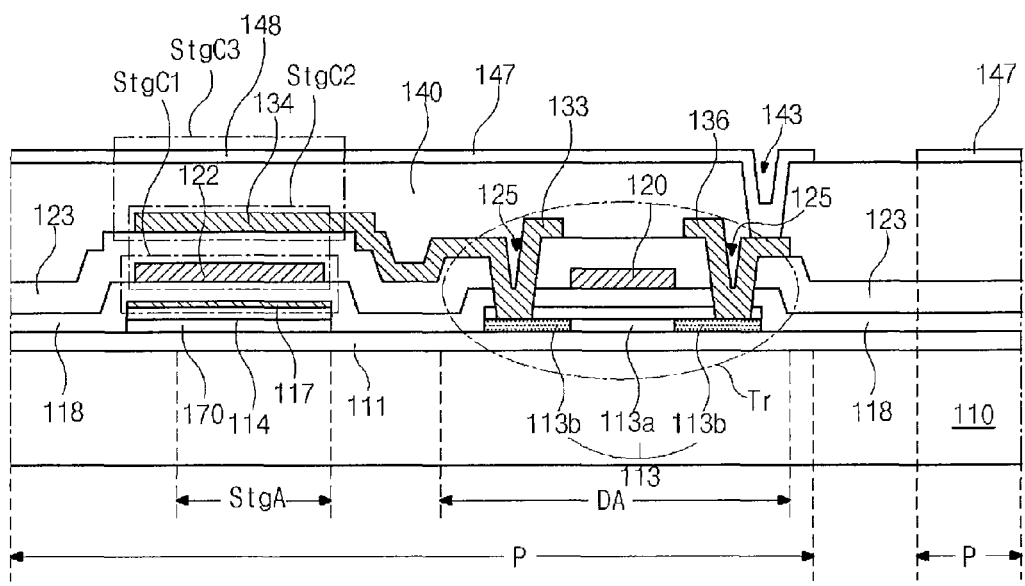
Figure 1Q:
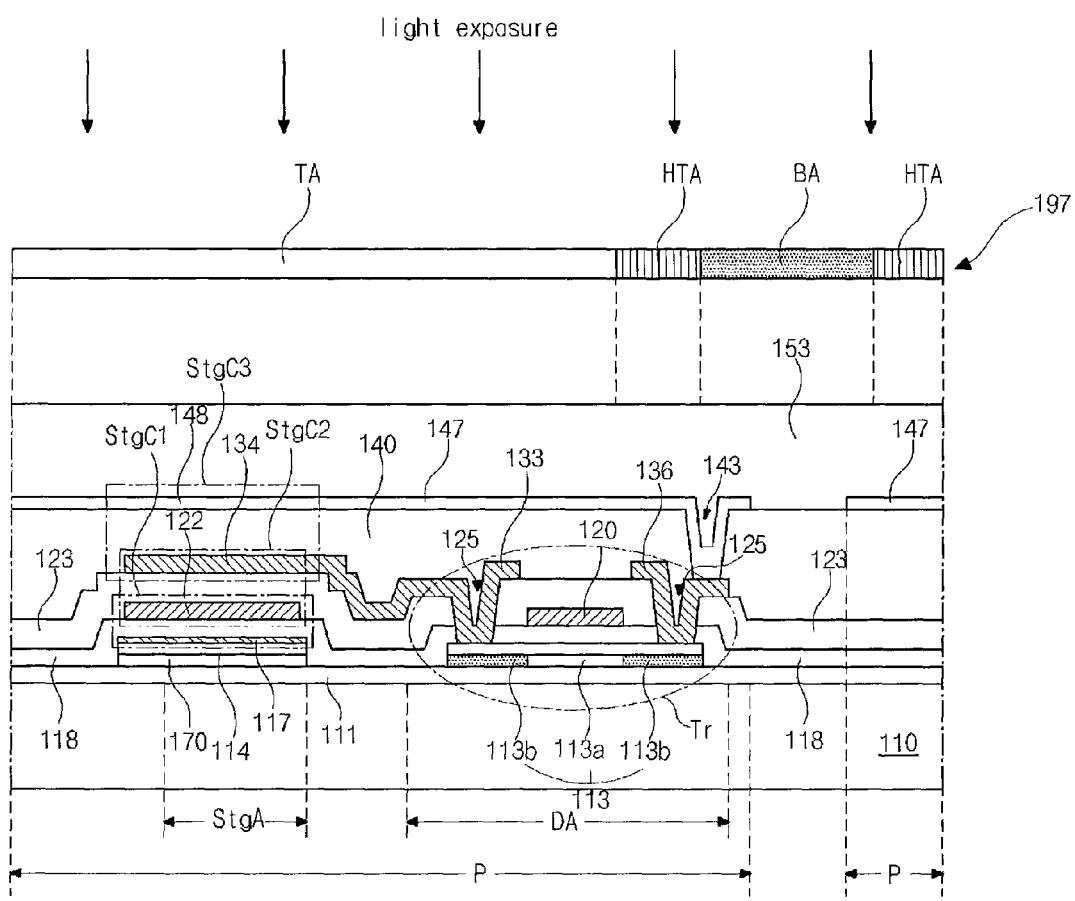
Figure 1R:
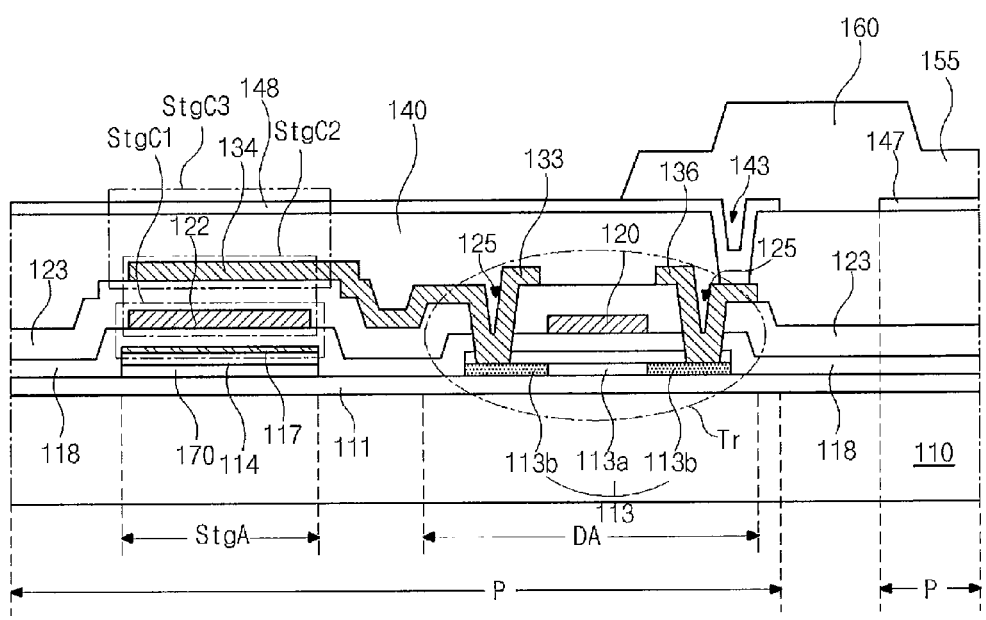

FIGS. 1A to 1R are cross-sectional views of illustrating a pixel region of an array substrate for an organic electroluminescent display device in steps of fabricating the same according to an exemplary embodiment of the present invention. For convenience of explanation, in each pixel region P, an area where a thin film transistor is formed is defined as a driving area DA, and an area where a storage capacitor is formed is defined as a storage area StgA. The thin film transistor in the driving area DA functions as a driving thin film transistor connected to an organic light-emitting diode, and although not shown in the figures, a switching thin film transistor having the same structure as the driving thin film transistor is formed and is connected to a gate line and a data line.

In FIG. 1A, a buffer layer 105 is formed on a substrate 100 by depositing an inorganic insulating material such as silicon nitride (SiNx) or silicon oxide (SiO2). When amorphous silicon is crystallized into polycrystalline silicon, alkali ions in the substrate 110 such as potassium ion (K+) or sodium ion (Na+), for example, may be diffused due to heats generated from laser irradiation or heat treatment. The buffer layer 111 prevents a semiconductor layer of polycrystalline silicon from being degraded by the alkali ions. The buffer layer 105 may be omitted depending on a material of the substrate 110.

Then, an amorphous silicon layer 105 is formed on a substantially entire surface of the substrate 110 by depositing amorphous silicon on the buffer layer 111.

In FIG. 1B, a polycrystalline silicon layer 106 is formed by crystallizing the amorphous silicon layer 105 of FIG. 1A, and mobility properties of the polycrystalline silicon layer 106 are improved as compared with the amorphous silicon layer 105 of FIG. 1A. Impurities are not doped in the amorphous silicon layer 105 of FIG. 1A and the polycrystalline silicon layer 106. Beneficially, a solid phase crystallization method or a laser crystallization method may be performed to crystallize the amorphous silicon layer 105 of FIG. 1A.

More particularly, the solid phase crystallization method may be a thermal crystallization method of performing heat treatment under temperatures of 600 degrees of Celsius to 800 degrees of Celsius or an alternating magnetic field crystallization method under temperatures of 600 degrees of Celsius to 700 degrees of Celsius using alternating magnetic field apparatus. The laser crystallization method may be an excimer laser annealing method or a sequential lateral solidification method.

In FIG. 1C, a first insulating layer 108 is formed on the polycrystalline silicon layer 106 by depositing an inorganic insulating material such as silicon nitride (SiNx) or silicon oxide (SiO2), for example.

Next, a first metallic layer 109 is formed on a substantially entire surface of the first insulating layer 108 by depositing a metallic material, for example, one of aluminum (Al), aluminum alloy such as aluminum neodymium (AlNd), molybdenum (Mo) and molybdenum titanium (MoTi) alloy.

In FIG. 1D, a photoresist layer 180 is formed on the first metallic layer 109 by applying photoresist. A photo mask 195 is disposed over the photoresist layer 180, and the photoresist layer 180 is exposed to light through the photo mask 195. The photo mask 195 includes a light-transmitting area TA, a light-blocking area BA, and a half light-transmitting area HTA.

The half light-transmitting area HTA may include slits or a multi-layered coating layer. When light passes through the half light-transmitting area HTA, light may be diffracted by the slits or may be partially transmitted. Thus, the intensity of light passing through the half light-transmitting area HTA is less than the intensity of light passing through the light-transmitting area TA.

In FIG. 1E, a first photoresist pattern 181a and a second photoresist pattern 181b are formed on the first metallic layer 109 by developing the photoresist layer 180 of FIG. 1D exposed to light through the photo mask 195 of FIG. 1D. The first photoresist pattern 181a corresponds to the light-transmitting area TA of FIG. 1D of the photo mask 195 of FIG. 1D and has a first thickness. The second photoresist pattern 181b corresponds to the half light-transmitting area HTA of FIG. 1D of the photo mask 195 of FIG. 1D and has a second thickness, which is thinner than the first thickness. The photoresist layer 180 of FIG. 1D corresponding to the light-blocking area BA of FIG. 1D is removed to thereby exposed the first metallic layer 109.

In FIG. 1F, the first metallic layer 109 of FIG. 1E, the first insulating layer 108 of FIG. 1E and the polycrystalline silicon layer 106 are sequentially etched and removed by using the first and second photoresist patterns 181a and 181b as an etching mask, thereby forming a semiconductor layer 113, a first metallic dummy pattern 172, a dummy polycrystalline silicon pattern 170, a first storage electrode 117 and a first gate insulating layer 114. The semiconductor layer 113 of polycrystalline silicon, a first portion of the first gate insulating layer 114 and the first metallic dummy pattern 172 are sequentially formed in the driving area DA. The dummy polycrystalline silicon pattern 170, a second portion of the first gate insulating layer 114 and the first storage electrode 117 are sequentially formed in the storage area StgA.

In FIG. 1G, an ashing process is performed, thereby removing the second photoresist pattern 181b of FIG. 1F having the second thickness and exposing the first metallic dummy pattern 172 in the driving area DA.

At this time, the first thickness of the first photoresist pattern 181a is also decreased due to the ashing process, and the first photoresist pattern 181a still remains on the first storage electrode 117.

In FIG. 1H, the first metallic dummy pattern 172 of FIG. 1G, which is exposed by removing the second photoresist pattern 181b of FIG. 1F, is removed to thereby expose the first portion of the first gate insulating layer 114 in the driving area DA.

Next, in FIG. 1I, the first photoresist pattern 181a of FIG. 1H is stripped and removed, and the first storage electrode 117 is exposed.

In FIG. 1J, a second gate insulating layer 118 is formed over a substantially entire surface of the substrate 110 by depositing an inorganic insulating material such as silicon oxide (SiO2) or silicon nitride (SiNx) on the first storage electrode 117 and the first portion of the first gate insulating layer 114.

Here, the second gate insulating layer 118, beneficially, may be formed of a different material from the first gate insulating layer 114. For example, when the first gate insulating layer 114 is formed of silicon oxide (SiO2), the second gate insulating layer 118 may be formed of silicon nitride (SiNx). Alternatively, when the first gate insulating layer 114 is formed of silicon nitride (SiNx), the second gate insulating layer 118 may be formed of silicon oxide (SiO2).

In FIG. 1K, a gate metallic layer (not shown) is formed on the second gate insulating layer 118 by depositing one or more than two metallic materials having relatively low resistivity, for example, aluminum (Al), aluminum alloy such as aluminum neodymium (AlNd), molybdenum (Mo) or molybdenum titanium (MoTi) alloy, and the gate metallic layer is patterned through a mask process to thereby form a gate line (not shown), a gate electrode 120, and a second storage electrode 122. The gate line extends in a first direction along a border of the pixel region P. The gate electrode 120 is electrically connected to the gate line and is disposed in the driving area DA to correspond to a central portion of the semiconductor layer 113. The second storage electrode 122 is disposed in the storage area StgA. The first storage electrode 117, the second gate insulating layer 118 and the second storage electrode 122 sequentially formed in the storage area StgA constitute a first storage capacitor StgC1.

Next, in FIG. 1L, n-type or p-type impurities are doped into the semiconductor layer 113 using the gate electrode 120 as a doping mask, and ohmic contact layers 113b including the impurities therein are formed at both sides of the central portion of the semiconductor layer 113. The central portion of the semiconductor layer 113, in which impurities are not doped due to the gate electrode 120, becomes an active layer 113a.

In FIG. 1M, an inter insulating layer 123 is formed on a substantially entire surface of the substrate 110 including the gate electrode 120, the gate line (not shown) and the second storage electrode 122 by depositing an inorganic insulating material such as silicon oxide (SiO2) or silicon nitride (SiNx) or applying an organic insulating material such as benzocyclobutene (BCB) or photo acryl.

The inter insulating layer 123 is patterned with the first gate insulating layer 114 through a mask process to thereby form semiconductor contact holes 125 exposing the ohmic contact layers 113b of the semiconductor layer 113, respectively.

Next, in FIG. 1N, a second metallic layer (not shown) is formed on a substantially entire surface of the inter insulating layer 123 having the semiconductor contact holes 125 by depositing one or more than two metallic materials, for example, aluminum (Al), aluminum alloy such as aluminum neodymium (AlNd), copper (Cu), copper alloy, molybdenum (Mo) or molybdenum titanium (MoTi) alloy. The second metallic layer is patterned through a mask process to thereby form a data line (not shown), a power line (not shown), and source and drain electrodes 133 and 136. The data line extends in a second direction along another border of the pixel region P and crosses the gate line to define the pixel region P. The power line is spaced apart from and parallel to the data line. The source and drain electrodes 133 and 136 are disposed in the driving area DA and are spaced apart from each other. The source and drain electrodes 133 and 136 contact the ohmic contact layers 113b through the semiconductor contact holes 125, respectively. The gate electrode 120, the semiconductor layer 113, and the source and drain electrodes 133 and 136 form a thin film transistor Tr, and more particularly, a driving thin film transistor.

Here, the source electrode 133 extends into the storage area StgA and a portion extending from the source electrode 133 and disposed in storage area StgA becomes a third storage electrode 134. In the storage area StgA, the second storage electrode 122, the inter insulating layer 123, and the third storage electrode 134 constitute a second storage capacitor StgC2. The first and second storage capacitors StgC1 and StgC2 are connected to each other in parallel through the second storage electrode 122, and a total capacitance of the storage capacitors StgC1 and StgC2 increases.

In FIG. 1O, a passivation layer 140 is formed on a substantially entire surface of the substrate 110 including the source and drain electrodes 133 and 136, the data line, the power line and the third storage electrode 134 by applying an organic insulating material such as benzocyclobutene (BCB) or photo acryl. The passivation 140 has an even top surface to flatten steps of under layers. The passivation layer 140 is patterned through a mask process to thereby form a drain contact hole 143 exposing the drain electrode 136 of the thin film transistor Tr. The drain contact hole 143 is to contact a first electrode of an organic light-emitting diode, which is formed on the passivation layer 140 later, with the drain electrode 136 of the driving thin film transistor Tr.

Next, in FIG. 1P, a first electrode 147 is formed on the passivation layer 140 having the drain contact hole 143 by depositing a transparent conductive material having relatively high work function, for example, indium tin oxide (ITO) or indium zinc oxide (IZO) and then patterning it. The first electrode 147 contacts the drain electrode 136 through the drain contact hole 143.

Here, to improve luminous efficiency, a metallic material having relatively high reflectance, for example, aluminum (Al), aluminum alloy such as aluminum neodymium (AlNd) or silver (Ag) may be deposited before depositing the transparent conductive material and then may be patterned with the deposited transparent conductive material, thereby forming a first electrode, which has a double-layered structure of a lower layer of the metallic material having relatively high reflectance and an upper layer of the transparent conductive material having relatively high work function. In this case, the organic electroluminescent display device may be a top emission type, which light is transmitted through a second electrode of the organic light-emitting diode.

In the meantime, the first electrode 147 extends into the storage area StgA, and a portion of the first electrode 147 in the storage area StgA functions as a fourth storage electrode 148. The fourth storage electrode 147, the passivation layer 140 and the third storage electrode 134 constitute a third storage capacitor StgC3. The second and third storage capacitors StgC2 and StgC3 are connected to each other in parallel through the third storage electrode 134, and a total capacitance of the storage capacitors in the pixel region P increases.

In the present invention, the first, second and third storage capacitors StgC1, StgC2 and StgC3 in the storage area StgA are connected in parallel, and the total storage capacitance is increased as compared to the related art.

In FIG. 1Q, a third insulating layer 153 is formed on the first electrode 147 by applying an organic insulating material having a photosensitive property, for example, photo acryl, benzocyclobutene (BCB) or polyimide. A photo mask 197 is disposed over the third insulating layer 153, and the third insulating layer 153 is exposed to light through the photo mask 197. The photo mask 197 includes a light-transmitting area TA, a light-blocking area BA and a half light-transmitting area HTA. A diffraction exposure or a halftone exposure may occur due to the half light-transmitting area HTA of the photo mask 197.

In FIG. 1R, a spacer 160 and a bank 155 are formed by developing the third insulating layer 153 of FIG. 1Q exposed to light. The spacer 160 corresponds to the light-blocking area BA of FIG. 1Q of the photo mask 197 of FIG. 1Q and has a first thickness. The spacer 160 is disposed between adjacent pixel regions P and along a border of the pixel region P. The bank 155 corresponds to the half light-transmitting area HTA of FIG. 1Q of the photo mask 197 of FIG. 1Q and has a second thickness thinner than the first thickness. The bank 155 is disposed along the border of the pixel region P. The bank 155 overlaps the first electrode 147.

Here, a portion of the third insulating layer 153 of FIG. 1Q corresponding to the light-transmitting area TA of FIG. 1Q of the photo mask 197 of FIG. 1Q is removed to expose the first electrode 147 in the pixel region P. Therefore, the array substrate for the organic electroluminescent display device is completed.

In the embodiment of the present invention, the array substrate including the spacer 160 and the bank 155 is manufactured through seven mask processes. The manufacturing processes of the array substrate are reduced as compared with the related art array substrate, which is manufactured through nine mask processes. The manufacturing time and costs are decreased.

Meanwhile, although not shown in the figures, an organic luminous layer is formed by disposing a shadow mask, which has an opening corresponding to the pixel region P, on the spacer 160 such that the shadow mask may contact the spacer 160 and performing thermal deposition under vacuum. Subsequently, a second electrode is formed on the organic luminous layer by depositing a metallic material having a relatively low work function, for example, aluminum, aluminum alloy, aluminum magnesium alloy, magnesium silver alloy or silver, all over a display area. The first electrode 148, the organic luminous layer and the second electrode constitute an organic light-emitting diode.

Then, a counter substrate may be disposed over the array substrate. A seal pattern may be formed along edges of the array substrate and the counter substrate under vacuum or inert gas atmosphere, and then the array substrate and the counter substrate may be attached to each other. Alternatively, the array substrate and the counter substrate may be attached with a face seal therebetween.

Accordingly, the organic electroluminescent display device according to the present invention may be completed.

In the array substrate including the polycrystalline silicon thin film transistor according to the present invention, three storage capacitors are connected in parallel and their electrodes overlap each other. A storage capacitance per unit area is increased.

The array substrate including the polycrystalline silicon thin film transistor according to the present invention is manufactured through seven mask processes, and the manufacturing processes are reduced in comparison with the related art. Furthermore, the manufacturing costs are decreased.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A method of fabricating an array substrate for an organic electroluminescent display device, comprising:
    preparing a substrate including a pixel region, a driving area and a storage area;
    forming a semiconductor layer, a semiconductor dummy pattern, a first storage electrode and a first gate insulating layer on the substrate, wherein the semiconductor layer and a first portion of the first gate insulating layer are sequentially disposed in the driving area, and the semiconductor dummy pattern, a second portion of the first gate insulating layer and the first storage electrode are sequentially disposed in the storage area;
    forming a second gate insulating layer on the semiconductor layer and the first storage electrode;
    forming a gate electrode and a second storage electrode on the second gate insulating layer, wherein the gate electrode corresponds to a central portion of the semiconductor layer, and the second storage electrode corresponds to the first storage electrode;
    forming ohmic contact layers by doping impurities into both sides of the semiconductor layer using the gate electrode as a doping mask;
    forming an inter insulating layer on the gate electrode and the second storage electrode, wherein the inter insulating layer has first and second contact holes exposing the ohmic contact layers;
    forming source and drain electrodes and a third storage electrode on the inter insulating layer, wherein the source and drain electrodes contact the ohmic contact layers, and the third storage electrode corresponds to the second storage electrode;
    forming a passivation layer on the source and drain electrodes and the third storage electrode, wherein the passivation layer has a drain contact hole exposing the drain electrode;
    forming a first electrode and a fourth storage electrode on the passivation layer, wherein the first electrode contacts the drain electrode through the drain contact hole, and the fourth storage electrode corresponds to the third storage electrode; and
    forming a spacer and a bank on the first electrode, wherein the spacer is disposed between adjacent pixel regions and has a first thickness, and the bank is disposed along a border of the pixel region and has a second thickness thinner than the first thickness,
    wherein forming the semiconductor layer, the semiconductor dummy pattern, the first storage electrode and the first gate insulating layer includes:

forming an amorphous silicon layer on the substrate;
forming a polycrystalline silicon layer by crystallizing the amorphous silicon layer;
forming a first insulating layer on the polycrystalline silicon layer;
forming a first metallic layer on the first insulating layer;
forming a first photoresist pattern in the storage area and a second photoresist pattern in the driving area, wherein the first photoresist pattern is thicker than the second photoresist pattern;
removing the first metallic layer, the first insulating layer and the polycrystalline silicon layer using the first and second photoresist patterns as an etching mask, thereby forming the semiconductor dummy pattern, the second portion of the first gate insulating layer and the first storage electrode in the storage area and forming the semiconductor layer, the first portion of the first gate insulating layer and a metallic dummy pattern in the driving area;
removing the second photoresist pattern by an ashing process to expose the metallic dummy pattern;
removing the metallic dummy pattern to expose the first portion of the first gate insulating layer; and
removing the first photoresist pattern.

2. The method according to claim 1, wherein the third storage electrode is connected to the source electrode.

3. The method according to claim 1, wherein the fourth storage electrode is connected to the first electrode.

4. The method according to claim 1, wherein the passivation layer has an even top surface.

5. The method according to claim 1, wherein forming the spacer and the bank on the first electrode includes:
forming an insulating layer on the first electrode by applying a photosensitive organic insulating material;
exposing the insulating layer to light through a mask including a light-transmitting area, a light-blocking area and a half light-transmitting area;
developing the insulating layer exposed to light to thereby form the bank and the spacer.

6. The method according to claim 1, wherein forming the gate electrode and the second storage electrode includes forming a gate line, and forming the source and drain electrodes and the third storage electrode includes forming a data line and a power line, wherein the gate line and the data line cross each other to define the pixel region, and the power line is parallel to the data line.

7. The method according to claim 1, further comprising a step of forming a buffer layer on the substrate before forming the semiconductor layer, the semiconductor dummy pattern, the first storage electrode and the first gate insulating layer.

8. The method according to claim 1, wherein forming the first electrode and the fourth storage electrode includes:
forming a lower conductive layer on the passivation layer, wherein the lower conductive layer has relatively high reflectance;
forming an upper conductive layer on the lower conductive layer, wherein the upper conductive layer has relatively high work function; and
patterning the upper conductive layer and the lower conductive layer.

9. The method according to claim 1, wherein forming the first electrode and the fourth storage electrode includes:
forming a transparent conductive layer on the passivation layer, wherein the transparent conductive layer has relatively high work function; and
patterning the transparent conductive layer.

* * * * *